United States Patent
Gagea et al.

[11] Patent Number: 5,991,905
[45] Date of Patent: Nov. 23, 1999

[54] PROCESS AND DEVICE FOR TESTING A MEMORY ELEMENT

[75] Inventors: Leonard Gagea; Peter Trojacher, both of Vienna, Austria

[73] Assignee: Robert Bosch GmbH, Germany

[21] Appl. No.: 08/919,067

[22] Filed: Aug. 22, 1997

[30] Foreign Application Priority Data

Aug. 24, 1996 [DE] Germany ............... 196 34 320

[51] Int. Cl.⁶ ................................. G11C 29/00
[52] U.S. Cl. ................. 714/721; 714/718; 714/799
[58] Field of Search ................. 714/721, 718, 714/799

[56] References Cited

U.S. PATENT DOCUMENTS 5,345,392  9/1994  Mito et al. ........................ 364/483
5,514,946  5/1996  Lin et al. ........................... 320/31

FOREIGN PATENT DOCUMENTS 37 04 938  8/1988  Germany.
44 09 286  8/1995  Germany.

*Primary Examiner*—Phung M. Chung
*Attorney, Agent, or Firm*—Kenyon & Kenyon

[57] ABSTRACT

A device and a process for testing a memory element are described. A second memory element is connected in parallel to the first memory element. In order to measure the charge status of the first memory element, the second memory element is brought into a predefined first status and the time required by the second memory element to go from the first status to a second status is measured. This time is analyzed in order to test the memory element.

10 Claims, 3 Drawing Sheets

PROCESS AND DEVICE FOR TESTING A MEMORY ELEMENT

FIELD OF THE INVENTION

The present invention relates to a process and a device for testing a memory element.

BACKGROUND INFORMATION

German Patent Application No. 37 04 938 discloses a controller with at least one microprocessor and one memory element. The memory element can operate at voltages below the supply voltage of the controller and/or the microprocessor. A status signal polled by the microprocessor is stored in the memory element.

German Patent Application No. 44 09 286 discloses a process and a circuit for detecting the cause of a reset of a microprocessor-controlled system. Also here, a memory element is provided, which does not lose its contents when the supply voltage is briefly interrupted, however, it does lose its contents when shut off for a longer period. Whether the memory element was shut off for a short or a longer period can be verified by reading the memory element voltage.

Since the safety requirements for automotive components are usually very high, the mode of operation of the memory element must be insured at all times.

SUMMARY OF THE INVENTION

The object of the present invention is to test the operating condition of a memory element that indicates the status of a device, in particular an automobile engine. The memory element can be tested in a simple and reliable manner using the procedure according to the present invention.

DETAILED DESCRIPTION

Controllers including, for example, a microprocessor are used for controlling internal combustion engines. The status of the microprocessor is stored in a memory. The contents of the memory must be preserved when the voltage is briefly interrupted, while the contents are lost in the case of longer interruptions, in particular when the internal combustion engine is shut off. RC elements are preferably used here as memory elements.

Figure 1:
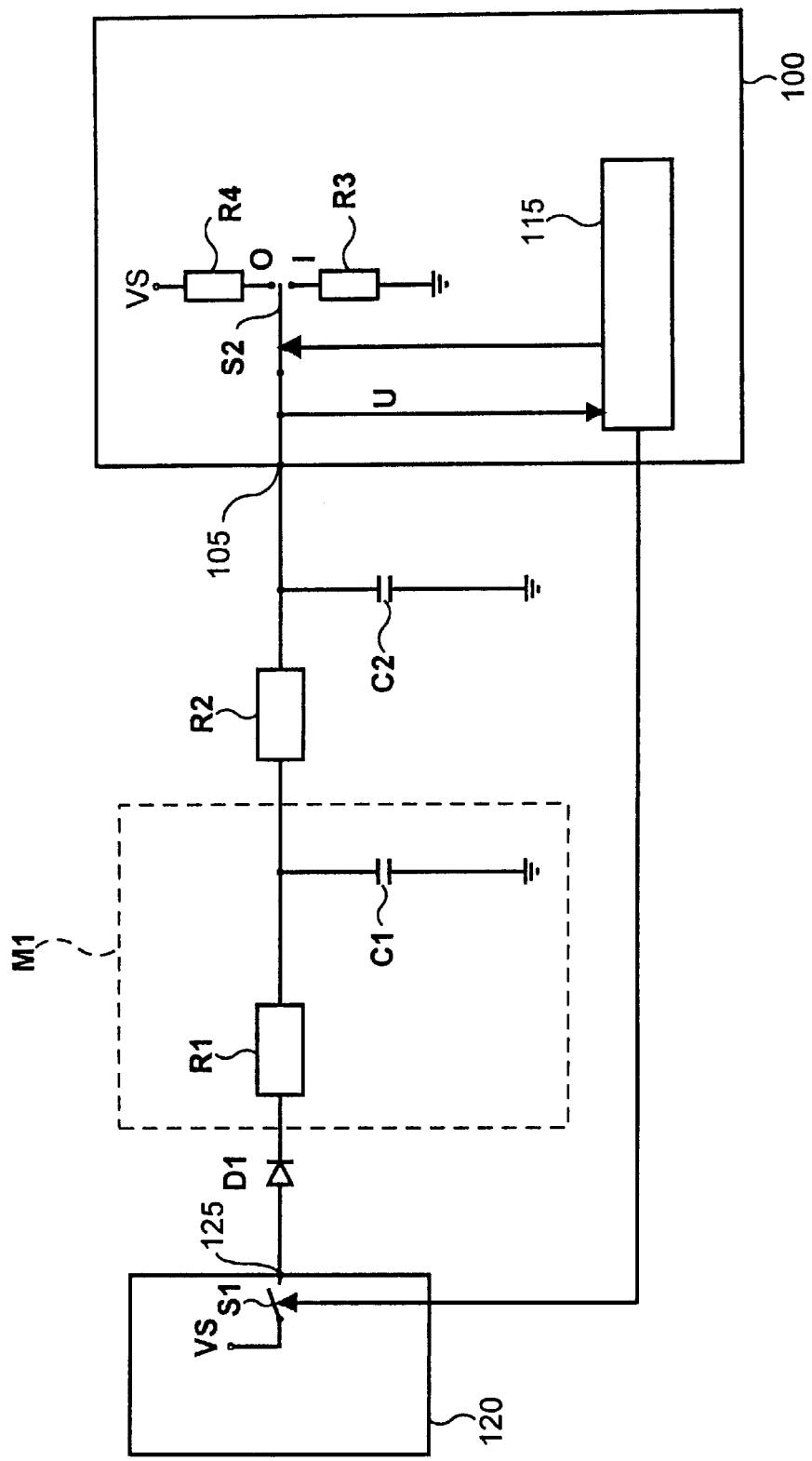
FIG. 1 shows a schematic representation of an exemplary device for testing a memory element according to the present invention.

FIG. 1 shows an exemplary device for testing a memory element according to the present invention. A block 120 includes a first switching means S1, which connects a first port 125 to a supply voltage VS.

A microcomputer 100 includes a second switching means S2 which connects a second port 105 to either a low resistance resistor R4, or a high resistance resistor R3. The high resistance resistor R3 is further connected to an input I, and on the other hand to the ground. The low resistance resistor R4 is further connected on the one hand to a supply voltage VS, and on the other hand to an output O. The microcomputer 100 further includes a monitor device 115 which sends control signals to the first and second switching means S1 and S2.

The first port 125 is connected to the second port 105 through a diode D1, a first resistor R1, a capacitor C1 which is further connected to the ground, a second resistor R2, and a second capacitor C2 which is further connected to the ground. The first resistor R1 and the first capacitor C1 form a memory element M1. This memory element can be written to, for example, by block 120 and/or microcomputer 100 and can be read by microcomputer 100. The microcomputer 100 and block 120 are elements of, for example, a controller, preferably used for the open- and/or closed-loop control of parameters in an automobile.

Instead of the supply voltage, another fixed voltage, in particular a voltage displaying a high signal level, can also be used. In that case, the resistance of resistor R4 is considerably lower than that of resistor R3.

Switching means S1 and second switching means S2 receive control signals from a monitor 115. The monitor 115 also receives a signal U, which corresponds to the voltage applied to port 105.

Switching means S1 and S2 are only symbolically represented as switching means; other implementations of switching devices are also possible. Switching means S2 illustrates that port 105 can be operated either as a high-resistance input or a low-resistance output.

The exemplary device according to the present invention operates as follows. If the controller is started up, switching means S1 is in its closed position, and first capacitor C1 is charged via resistor R1. The same is true for second capacitor C2. After a certain period of time, the second port 105 is at a high potential.

If the voltage VS at first port 125 drops to zero, the first capacitor is discharged through the second resistor R2, switching means S2, and resistor R3 to the vehicle ground. Similarly, the second capacitor C2 is discharged through switching means S2 and resistor R3 to the vehicle ground.

The resistors are chosen so that resistor R1 and resistor R4 have, for example, a very low resistance, while resistor R2 and resistor R3 have, for example, a very high resistance.

If the controller is in operation, port 105 has, in general, a high resistance. If the voltage drops, it causes capacitors C1 and C2 to discharge very slowly.

If the controller is shut off, this means that port 105 acquires a low resistance, which causes capacitor C2 to discharge very quickly and the first capacitor C1 to discharge very slowly. When the controller is shut off, both capacitors C1 and C2 are discharged through resistor R4. If the voltage drop is very brief, the first capacitor may discharge only slightly, and the voltage at port 105 only drops very slightly.

By analyzing voltage U at port 105, the microcomputer can distinguish between a brief and a longer voltage drop that has occurred. A brief voltage drop occurred if the voltage drop at first port 125 was shorter than the time constant of the RC element comprising first capacitor C1 and second resistor R2. Resistor R4 has a small resistance compared to that of resistor R2 and can therefore be ignored.

Figure 2:
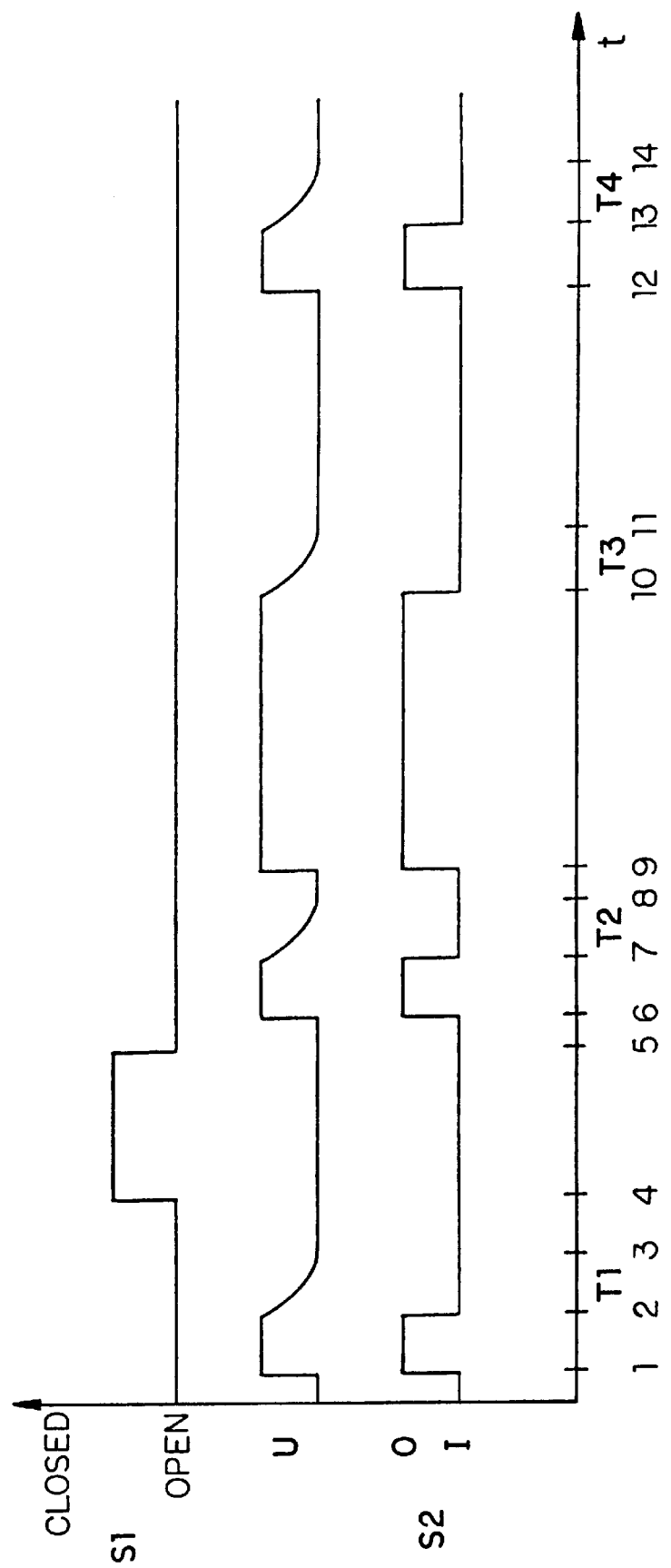
FIG. 2 shows different signals plotted against time t according to an embodiment of the present invention.

The procedure to test resistors R1, R2 and capacitors C1 and C2 is the following. Reference is made to the exemplary embodiment illustrated in FIG. 2 for an explanation of the procedure. The first line shows the variation of the position of first switching means S1 over time t. This parameter corresponds to the signal level at the first port 125. The second line shows the variation of voltage U at second port 105 over time. The third line shows the switching position of the second switch S2 over time. In position I, port 105 is switched to become a high internal resistance input, and in position O, it is switched to become a low internal resistance output. Only the level at port 105 is analyzed by monitor 115. Monitor 115 detects a low-level voltage that is below a first threshold value. The first threshold value is selected so that it shows that voltage U has dropped to zero on port 105. Monitor 115 detects a high-level voltage that is above a second threshold value.

Up to time 1, no voltage is applied to port 125. This means, for example, that switch S1 is in its open position. Switching means S2 is in the off position; this means that port 105 is switched to a low internal resistance, acting as an output.

At time 1, switching means S2 is activated so that second port 105 acts as a low internal resistance output. As a result, voltage U on second port 105 and therefore on capacitor C2 quickly rises to the level VS. This means that a high signal level is applied to port 105, since voltage U is greater than the second threshold value.

At time 2, switching means S2 is brought to position I. This means that port 105 is switched to become a high internal resistance input. As a result, capacitor C2 is discharged through resistor R2 into capacitor C1. A smaller portion of the charge flows through resistor R3 to the vehicle ground. Resistor R3 is selected so that its resistance is considerably greater than that of resistor R2.

As a result, voltage U at capacitor C2, i.e., at second port 105, drops exponentially to zero over time. At time 3, voltage U drops below the first threshold value again, i.e., a lower signal level is applied to port 105. This point in time is detected by the monitor 115. Time period T1 between times 2 and 3, corresponding to the time period in which the voltage on second capacitor C2 drops from U to zero, is used for the evaluation. This time period T1 basically depends on the time constant of RC element R2, C2, and the charge status of capacitor C1.

When this measurement is completed, first switching means S1 is activated at time 4 so that it closes. Starting at this time, first capacitor C1 is charged. After a predefined time period, this charge is completed at time 5 and a new measurement is started.

This new measurement of the charge status of first capacitor C1 starts at time 6. The procedure is similar to that used in the first-measurement, i.e., port 105 is switched again to become an output and at time 7 it is switched back to become an input. This means that voltage U at port 105 rises and, starting at time 7, it drops exponentially to zero until time 8.

The time period T2 between times 7 and 8, which corresponds to the discharge time of capacitor C2, is measured by controller 120. Since first capacitor C1 has been charged since the first measurement, and decay time T2 depends on the charge status, this decay time T2 becomes longer. The additional time basically only depends on the changed charge status of first capacitor C1.

At time 9, switching means S2 is activated so that port 105 acts as a low internal resistance output. As a result, first capacitor C1 and second capacitor C2 are charged through resistor,R4 and resistor R2. Since resistor R4 has a very low resistance, capacitor C2 is charged very quickly, while capacitor C1 is charged very slowly, since the resistance of resistor R2 is high compared to both that of resistor R4 and that of resistor R1. This means that the charge is slower than through resistor R1.

At time 10, switching means S2 is activated so that port 105 acts as a high resistance input. This means that capacitor C2 is discharged slowly through resistor R2 into capacitor C1. The period until the-discharge procedure at time 11 is completed is measured by controller 115 as time period T3. Since the charge status of capacitor C1 has changed again, i.e., it has a greater charge than it had at the time (T2) it was measured, capacitor C2 will discharge into capacitor C1 more slowly, i.e., time period T3 is again longer than time period T2.

Starting at time 11, switching means S2 is activated so that port 105 acts as a low-resistance input. For this to occur, resistor R3 must be variable. This means that it usually has a high resistance. In this position it has a low resistance. This can be accomplished, for example, by connecting a low-resistance resistor in parallel to resistor R3 in this phase. As a result, capacitor C1 is slowly discharged through resistor R3, and capacitor C2 is slowly discharged through resistors R2 and R3.

Starting at time 12, the charge status of capacitor C1 is measured again. For this purpose, switching means S2 is activated, starting at time 12, so that port 105 acts as a low-resistance output. At time 13, port 105 is switched back to become an input. This means that voltage U at port 105 rises until time 12 and drops exponentially to zero starting at time 12 until time 13. Then, starting at time 13, the decay time (T4), during which capacitor C2 is discharged into capacitor C1 through resistor R2, is measured. Since capacitor C2 is discharged faster compared to time period T3 when capacitor C1 was discharged, time T4 is slightly shorter than time T3.

According to the present invention, the charge status of the first capacitor C1 is measured, for example, by bringing the second capacitor C2 to a predefined status, i.e., its charged status, and by measuring time periods T1, T2, T3, and T4 needed by the second capacitor C2 to discharge into the first capacitor C1. The second port is switched to low resistance for the measurement in the first phase, with the memory device assuming its first status. In a second phase, port 105 is switched to a high-resistance status, and the memory device changes to its second status during this second phase.

This measurement is repeated multiple times with the charge status of-first capacitor C1 changing between the measurements. First capacitor C1 is preferably quickly charged between the first and second measurements, slowly charged between the second and third measurements, and slowly discharged between the third and fourth measurements.

Figure 3:
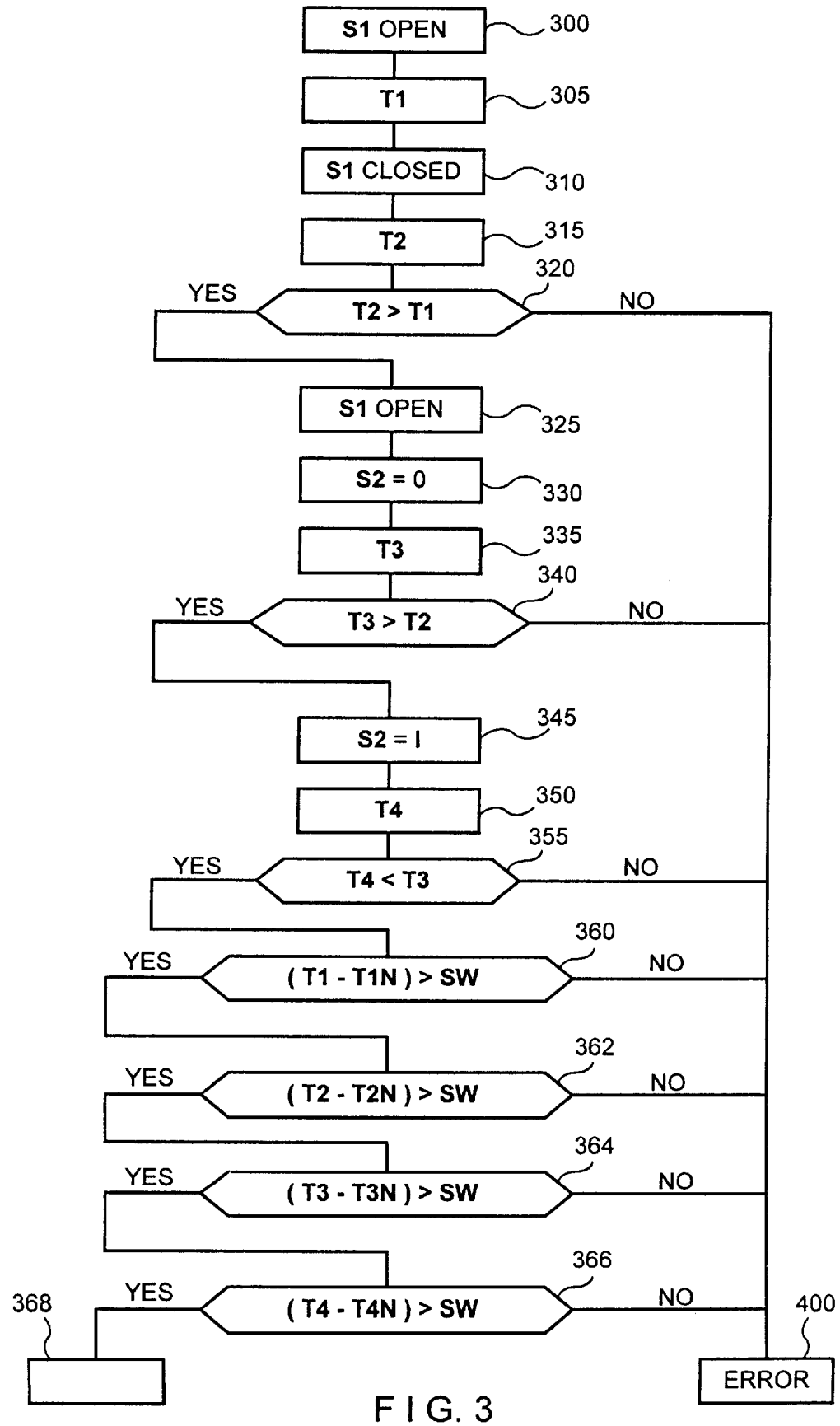
FIG. 3 is a flow chart showing an exemplary process according to the present invention.

The procedure according to the present invention is furthermore illustrated in the flow chart of FIG. 3. In a first step 300, the first switching means S1 is activated so that it is opened. Time period T1 is measured in step 305.

Subsequently in step 310, switching means S1 is activated so that it is closed and capacitor C1 is charged quickly. Then in step 315, the second measurement is performed by measuring time period T2. The subsequent query 320 verifies whether time period T2 is greater than time period T1. If this is not the case, an error is detected in step 400.

If this is the case, in step 325 switching means S1 is activated so that it is opened. In the subsequent step 330, switching means S2 is activated so that port 105 acts as a low-resistance output. As a result, capacitor C1 is slowly charged through port 105. Then in step 335, time period T3 is measured in a third measurement. The subsequent query 340 verifies whether time period T3 is greater than time period T2. If this is not the case, an error is detected in step 400.

If this is the case, in step 345 switching means S2 is activated so that port 105 acts as a high-resistance input. This means that capacitor C1 is slowly discharged through port 105. Subsequently, in step 350, the fourth time period T4 is measured. The subsequent query 355 verifies whether the fourth time period T4 is shorter than the third time period T3. If this is not the case, an error is detected in step 400.

Otherwise, the proper operation of the device is acknowledged in step 368.

It is particularly advantageous if query 355 is followed by additional queries 360 through 366, which verify whether times T1, T2, T3, and T4 deviate from predefined values T1N, T2N, T3N, and T4N, respectively. T1N through T4N are values that should be obtained when the device operates properly. For this purpose, query 360 verifies whether the absolute value of the difference T1–T1N is greater than a threshold value SW. If this is the case, an error is detected in step 400. Otherwise query 362 follows.

Query 362 verifies whether the absolute value of the difference T2–T2N is greater than a threshold value SW. If this is the case, an error is detected in step 400. Otherwise query 364 follows. Query 364 verifies whether the absolute value of the difference T3–T3N is greater than a threshold value SW. If this is the case, an error is detected in step 400. Otherwise query 366 follows. Query 366 verifies whether the absolute value of the difference T2–T2N is greater than a threshold value SW. If this is the case, an error is detected in step 400. Otherwise the proper operation of the device is acknowledged in step 368.

In an alternative embodiment according to the present invention, only time periods T1 through T4 are measured, and the values of capacitors C1, C2, and resistors R1 and R2 are calculated from the decay times T1 through T4 and the time periods during which the capacitor was charged and discharged. Since the threshold values at which a higher or lower level is detected at port 105 are subject to tolerances, the respective tolerances are obtained for decay times T1 through T4. The differences of decay times T1 through T4 are preferably analyzed to calculate the values of the capacitors and resistors.

If these calculated values deviate from the known values, an error is detected.

Resistors R1 and R2 and capacitors C1 and C2 are selected so that the time constants R1 multiplied by C1 and R2 multiplied by C2 are equal and resistor R2 has a considerably higher resistance than resistor R1.

As an alternative embodiment according to the present invention, measurement can also be performed by bringing capacitor C2 into its final discharged status through port 105. Then capacitor C2 is charged through resistor R2 by capacitor C1. The time period needed for recharging capacitor C2 is measured. For this purpose, capacitor C1 must be charged through port 125 prior to starting the measurement. The capacitors must be charged to the point where voltage U is sufficiently high so that port 105 detects a high signal level.

What is claimed is:

1. A method for testing a charge status of a first memory element, the first memory element being connected in parallel to a second memory element, the method comprising the steps of:

charging the second memory element into a predefined first status;

measuring a time period for the second memory element to discharge from the predefined first status to a predefined second status; and analyzing the measured time period to test the charge status of the first memory element.

2. The method according to claim 1, wherein the measuring step includes measuring the time period multiple times, the charge status of the first memory element changing between each of the multiple measuring time periods.

3. The method according to claim 2, wherein the charge status of the first memory element and a charge status of the second memory element are indicated as a function of the measured time periods.

4. The method according to claim 2, wherein each of the measured time periods is compared with at least one of another measured time period and a predefined value.

5. The method according to claim 2, further comprising the step of calculating a data value of the first memory element as a function of the measured time periods.

6. A device for testing a first memory element, comprising:

a second memory element connected in parallel to the first memory element;

a charge circuit charging the second memory element to a predefined first charged status to measure a charge status of the first memory element; and means for measuring a time period required by the second memory element to transition from the predefined first charged status to a first discharged status, the measured time period being analyzed to test the first memory element.

7. The device according to claim 6, wherein the first and second memory elements include capacitors.

8. The device according to claim 6, wherein the first memory element indicates a status of a controller.

9. A method for testing a first memory element, the first memory element being connected to a second memory element, the method comprising the steps of:

charging the second memory element to a predefined charged status;

measuring a time period for the second memory element to switch from the predefined charged status to a predefined discharged status; and analyzing the measured time period to test the first memory element.

10. A device for testing a first memory element, comprising:

a second memory element coupled to the first memory element;

a first switch coupling a supply voltage to the first memory element;

a second switch coupled to the second memory element; and a control device connected to the second switch, the control device including a monitor measuring a time for the second element to transition between a first charged status and a first discharged status, the control device analyzing the measured time to test the first memory element.

* * * * *